United States Patent [19]

Magdo et al.

[11] 4,357,622
[45] Nov. 2, 1982

[54] COMPLEMENTARY TRANSISTOR STRUCTURE

[75] Inventors: Ingrid E. Magdo, Hopewell Junction; Hans S. Rupprecht, Yorktown Heights, both of N.Y.

[73] Assignee: International Business Machines Corporation, Armonk, N.Y.

[21] Appl. No.: 113,168

[22] Filed: Jan. 18, 1980

[51] Int. Cl.³ ............... H01L 27/02; H01L 29/72
[52] U.S. Cl. .......................... 357/44; 357/34; 357/59; 357/65; 357/90; 357/91; 148/1.5
[58] Field of Search ............ 357/44, 34, 90, 65, 357/91, 59

[56] References Cited

U.S. PATENT DOCUMENTS 3,702,428  11/1972  Schmitz et al. ............... 357/44
3,730,786   5/1973  Ghosh ............................ 357/44

OTHER PUBLICATIONS

Davis et al, "Design of an Integrated Circuit . . . ", IEEE J. Solid-State Circuits, vol. SC-14 (2/79) pp. 109-120.
Abbas et al, "Complementary Bipolar Transistor Process Using Seven Masking Steps", IBM Technical Disclosure Bulletin, vol. 16 (10/73) pp. 1630-1631.
Chang et al, "Complementary Bipolar Device Structure", IBM Technical Disclosure Bulletin, vol. 17 (6/74) pp. 21-22.

*Primary Examiner*—Gene M. Munson
*Attorney, Agent, or Firm*—Joseph C. Redmond, Jr.

[57] ABSTRACT

Complementary, vertical bipolar NPN and PNP transistors are fabricated on the same monolithic semiconductor substrate which have matched high performance characteristics. A method for fabricating such complementary devices is also provided. In the method, a barrier region of a first conductivity type is formed on the surface of the monocrystalline semiconductor substrate doped with a second conductivity type. After an annealing heat treatment to drive in the doping ions of the barrier region, a collector region for one of the complementary transistors of a second conductivity type is formed within the barrier region. It is convenient to simultaneously form isolation regions of a second conductivity type in the substrate while forming the collector region. A collector region of a first conductivity type is then formed in the substrate for the other of the complementary transistors. The collector region for the other complementary transistor is formed within at least one other isolation region. An epitaxial layer of semiconductor material doped with ions of the first conductivity type is then formed on the surface of the substrate.

To provide improved PNP transistor performance, the P-type emitter for the PNP transistor is formed prior to a last drive-in treatment by forming a polycrystalline silicon layer on the exposed surface of the base. The polycrystalline silicon is doped with a P-type dopant. Thereafter the transistor structure is subjected to conditions whereby the doping ions contained in the polycrystalline silicon layer are driven into the epitaxial layer to provide a shallow emitter region without effecting dislocations in the silicon lattice of the epitaxial layer.

5 Claims, 24 Drawing Figures

COMPLEMENTARY TRANSISTOR STRUCTURE

BACKGROUND OF THE INVENTION

Many efforts have been directed at producing complementary PNP and NPN transistor pairs on a common monolithic semiconductor substrate. Generally, two problems have been encountered in producing complementary transistor pairs. Firstly, because of the lesser mobility of holes relative to electrons, PNP transistor characteristics are inherently inferior to those of NPN transistors. PNP transistors usually have a beta of no higher than about 10 and a cutoff frequency of no higher than about 500 MHz, whereas NPN transistors generally have a beta in excess of about 80 and a cutoff frequency in excess of about 3.5 GHz.

Although techniques have been available for tailoring impurity profiles in the respective emitter, base and collector regions of complementary transistors, it has usually been necessary to degrade the performance of the NPN transistor to match the performance characteristics of the PNP transistor. Secondly, it is necessary to provide a doped barrier around one of the pairs of complementary transistors. In the usual case of using a P-doped semiconductor substrate, an N-doped barrier must be formed around the PNP transistor. Many problems have been encountered in providing such doped barrier due to the tendency of the barrier surrounded transistor to regard the barrier as a further PN junction and to create a secondary transistor effect.

DESCRIPTION OF THE PRIOR ART

While the fabrication of complementary pairs of transistors on a common semiconductor substrate is highly desirable, the various efforts directed to producing complementary pairs of transistors have not been wholly successful. A complementary bipolar device structure is suggested in IBM Technical Disclosure Bulletin, Vol. 17, No. 1, June 1974, pp. 21-22. The structure set forth in this article, however, is only suggestive of an approach to providing a complementary pair of transistors and does not suggest or disclose any operating parameters required to produce a successful complementary bipolar device.

U.S. Pat. No. 3,730,786 to Ghosh, describes a method for fabricating a complementary pair of transistors. The method of the Ghosh patent differs substantially from the method set forth in the present invention. A significant feature of the Ghosh patent is the use of a highly doped N+ region formed at the surface of the substrate to act as a barrier for the PNP transistor device. In subsequent steps of the method of the Ghosh patent, the N+ doped region diffuses into the subsequently deposited epitaxial layer. Through ion migration and autodoping, a highly doped barrier region is formed which is superimposed over the subcollector region of the PNP transistor. The intersection of the N+ doped barrier region with the P subcollector of the PNP transistor forms a PN junction which may act to provide NPN transistor function during operation of the structure.

It should further be noted that the Ghosh patent relies upon boron diffusion to form the emitter region of the PNP transistor. PNP transistors having emitters formed by diffusion of boron have traditionally had lower operating characteristics than NPN transistors. Most importantly, such PNP transistors usually have a beta of less than about 10. The cutoff frequency of such PNP devices is also low compared to NPN devices and is usually about 500 MHz.

It would be desirable to provide complementary pairs of transistor devices on a common semiconductor substrate having matched high performance characteristics. It would also be desirable to provide a barrier for one of the transistor pairs which does not act to provide a secondary PN junction which can result in secondary transistor function.

SUMMARY OF THE INVENTION

The present invention is directed to complementary, vertical bipolar NPN and PNP transistors fabricated on the same monolithic semiconductor substrate which have matched high performance characteristics and to a method for fabricating such complementary devices. In the method, a barrier region of a first conductivity type is formed on the surface of a monocrystalline semiconductor substrate doped with a second conductivity type. After an annealing heat treatment to drive in the doping ions of the barrier region, a collector region for one of the complementary transistors of a second conductivity type is formed within the barrier region. It is convenient to simultaneously form isolation regions of a second conductivity type in the substrate while forming the collector region. A collector region of a first conductivity type is then formed in the substrate for the other of the complementary transistors. The collector region for the other complementary transistor is formed within at least one other isolation region. An epitaxial layer of semiconductor material doped with ions of the first conductivity type is then formed on the surface of the substrate.

Recessed oxide isolation is then formed in the substrate by providing diffusion windows in a masking layer directly over the doped isolation regions in the substrate. The surface of the epitaxial layer is etched through the windows and the silicon of the epitaxial layer is thermally oxidized to provide the recessed oxide isolation regions surrounding each of the transistors.

A diffusion window is opened in a masking layer over the collector of the other transistor and doping ions of a first conductivity type are diffused through the window to provide a collector reach through contact. A window is then provided in a masking layer over the collector of the other transistor and a base region of a second conductivity type is formed in the collector of the other transistor. It is convenient to also open a window over the collector of the one transistor and to form the collector reach through contact at the same time. A window is then provided in a masking layer over the collector of the first one of the transistors and a base region is formed of a first conductivity type in the collector region of the transistor.

Windows are then provided in a masking layer over the base of the transistors for emitter, collector reach through and base contacts which require a doping ion of the first conductivity type. The base contact, emitter regions and collector contacts which require the first conductivity type are then formed simultaneously. Windows are then provided in a masking layer over the base of the transistors for an emitter, collector contact and base contact which require a doping ion of the second conductivity type and the base contact, collector contact and emitter region requiring doping ions of the second conductivity type are formed simultaneously.

To provide improved PNP transistor performance, the P-type emitter for the PNP transistor is formed prior to a last drive-in treatment by forming a polycrystalline silicon layer on the exposed surface of the base. The polycrystalline silicon is doped with a P-type dopant. Thereafter the transistor structure is subjected to conditions whereby the doping ions contained in the polycrystalline silicon layer are driven into the epitaxial layer to provide a shallow emitter region without effecting dislocations in the silicon lattice of the epitaxial layer.

DESCRIPTION OF THE PREFERRED EMBODIMENT OF THE COMPLEMENTARY TRANSISTOR STRUCTURE

Figure 8:
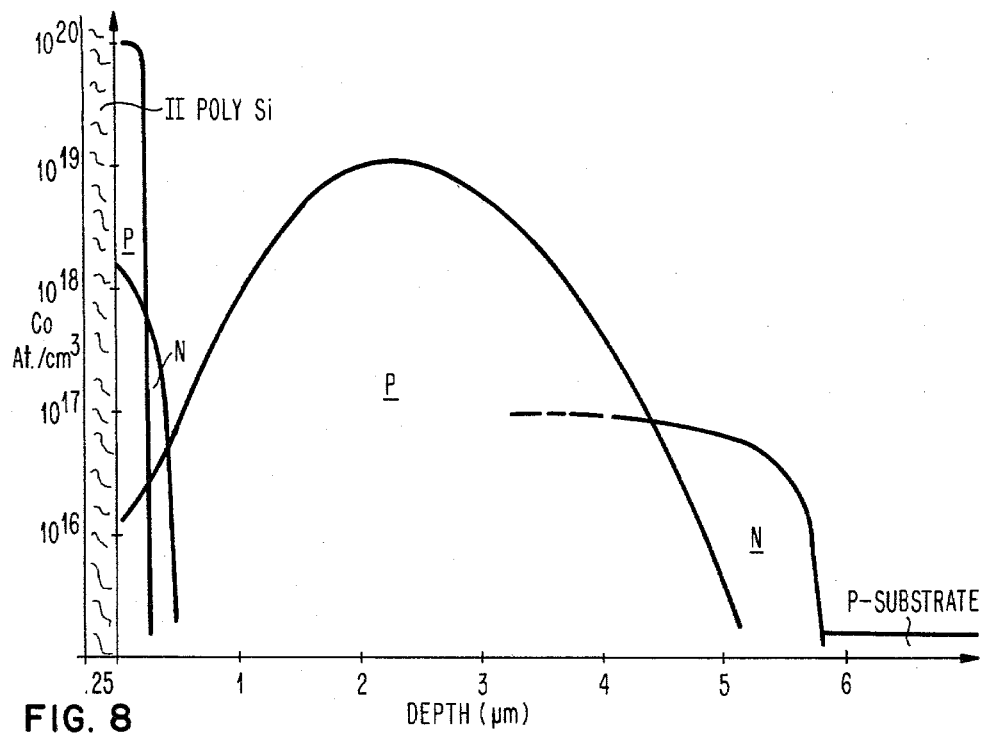
FIG. 8 is a typical impurity profile plot of the PNP transistor of FIG. 7.
Figure 9:
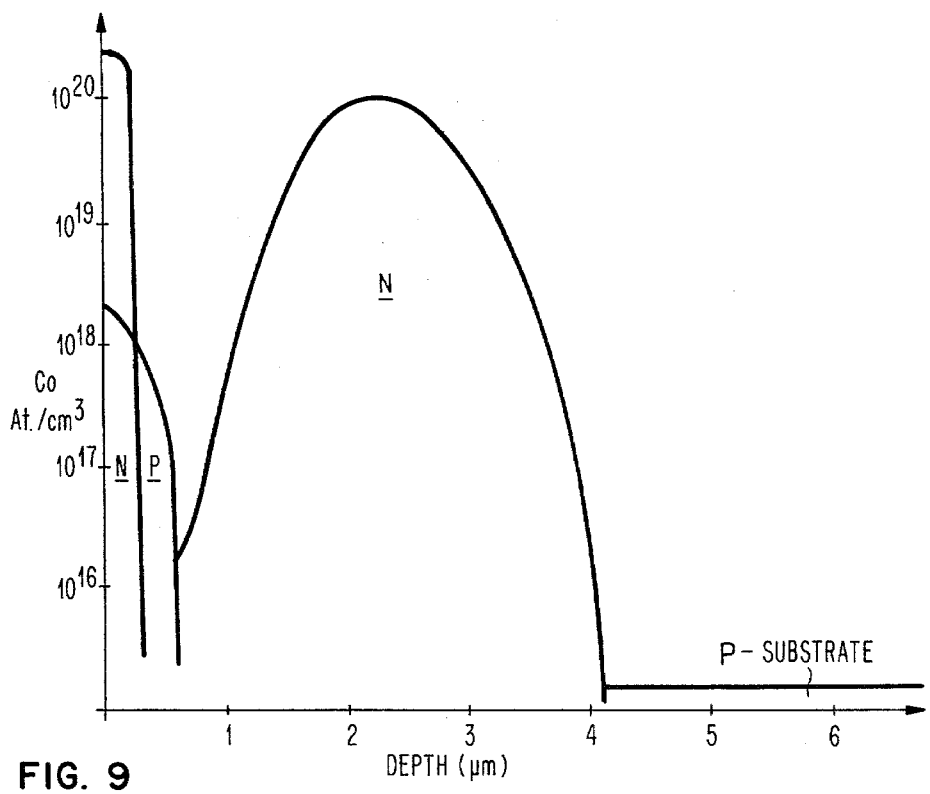
FIG. 9 is a typical impurity profile plot of the NPN transistor of FIG. 7.

FIGS. 1–7 will be described in terms of exemplary process parameter values. The typical impurity profile plots of FIGS. 8 and 9 illustrate an important feature of the present invention; that is, the relationship of the impurity concentration $C_0$ of the barrier region to the $C_0$ of the subcollector contained within the barrier region, particularly at the juncture therewith. Illustrated in FIGS. 1–7 is the use of a P-type silicon semiconductor substrate. P-type silicon substrates are, of course, used to produce NPN type transistors. NPN transistors have been extensively used because of their higher performance characteristics in comparison to PNP transistors. It should be understood, however, that the selection of a P-type silicon substrate is illustrative and the features of the present invention are equally adaptable to the use of N-type semiconductor substrates. It should also be understood that various conventional processes relating to application, exposing and developing of photoresist materials to form desired patterns are not specifically described herein.

Figure 1:
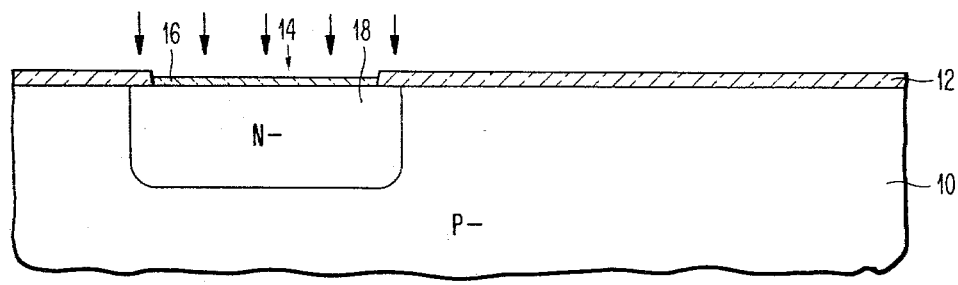
FIGS. 1 through 7 are simplified cross-sectional views, not to scale, of a pair of complementary transistors at various stages in the fabrication process of the present invention.
Figure 2:
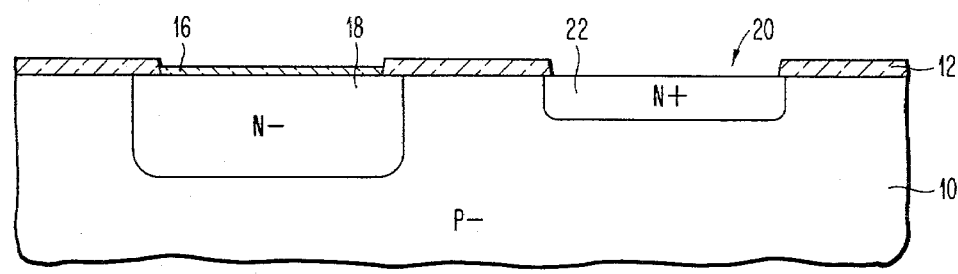
Figure 3:
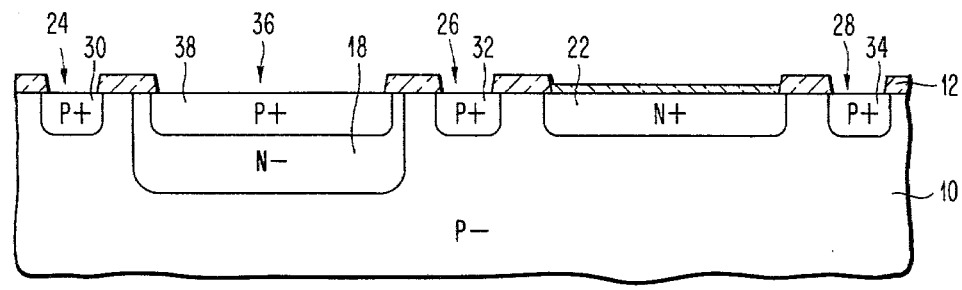

Referring to FIG. 1, P-type substrate 10 is provided having a sheet resistance in the range of from 10–20 ohm/cm². Substrate 10 is oxidized to provide a silicon oxide layer 12 having a thickness of about 3500 Å. The oxide layer 12 is etched to provide a window 14 exposing the surface of the silicon substrate. The surface of the substrate 10 is reoxidized to provide a thin layer 16 of silicon oxide having a thickness of about 300 Å. Phosphorus is then implanted into the window 14 by ion implant to provide a barrier region 18. It is important that the ion implantation of the P-type dopant be affected at high energy and low dosage. It is preferred to use an energy in the range of from about 200 to about 400 keV at a dosage level of from about $1 \times 10^{14}$ to about $1 \times 10^{15}$ ions/cm².

The high energy level used drives the ions to a depth which extends from the surface of the silicon substrate to about 0.5 microns beneath the surface. The substrate is then subjected to a heat cycle to drive the doping ions further into the surface of the silicon. A typical heat cycle is at a temperature of about 1100° C. for a period of from about 300 to about 500 minutes in an inert atmosphere of argon or nitrogen. After the heat drive in cycle, the barrier region 18 extends from the surface of the substrate to a depth of about 3.5 microns.

A diffusion window 20 is then opened in the oxide layer 12 for an N+ diffusion which serves as the subcollector 22 of the NPN transistor to be formed later. The N+ diffusion to form the subcollector 22 may be accomplished, for example, by an arsenic capsule diffusion process at 1050° C. for 150 minutes to produce a surface concentration of $2.5 \times 10^{20}$ ions/cc., a sheet resistance of 9.83 ohms/cm² and an initial junction depth of 1 micron.

After the drive-in, the impurity concentration $C_0$ of the doping ions of the barrier region at the interface with the subcollector is preferably in the range of from about $1 \times 10^{16}$ to about $5 \times 10^{17}$ atoms/cc. As can best be seen by reference to FIG. 8, the drive-in treatment also serves to redistribute the doping ions so that the distribution profile is relatively flat with no concentration peak higher than the $C_0$ of the interface. Preferably, the peak $C_0$ of the barrier region is in the range of from about $1 \times 10^{16}$ to about $5 \times 10^{17}$ atoms/cc. The $C_0$ of the barrier region is thus seen to extend from the interface with the subcollector at a level intermediate the $C_0$ of the P-substrate and the peak $C_0$ of the P+ subcollector, which is preferably from about $1 \times 10^{18}$ to about $1 \times 10^{20}$ atoms/cc. The provision of a barrier region with the heretofore described balanced properties is a unique and important feature of the complementary transistor structure of the invention.

After reoxidation to close the window over subcollector 22, diffusion windows 24, 26 and 28 are opened in oxide layer 12 for P+ diffusions to provide isolation cutoff regions 30, 32 and 34. At the same time, diffusion window 36 is opened for P+ diffusion to provide the subcollector region 38 for the PNP transistor to be subsequently formed. The P+ diffusions through windows 24, 26, 28 and 36 may be accomplished, for example, by a boron capsule diffusion process at 1050° C. for 100 minutes to produce a surface concentration of $2 \times 10^{20}$ ions/cc., a sheet resistance of 10 ohms/cm² and an initial junction depth of 2.1 microns. Substrate 10 is again reoxidized to close the diffusion windows using, for example, an oxygen-steam-oxygen cycle for 5-60-5 minutes, respectively. The boron, phosphorus and arsenic profiles further redistribute during this and other oxidation heat treatments.

Figure 4:
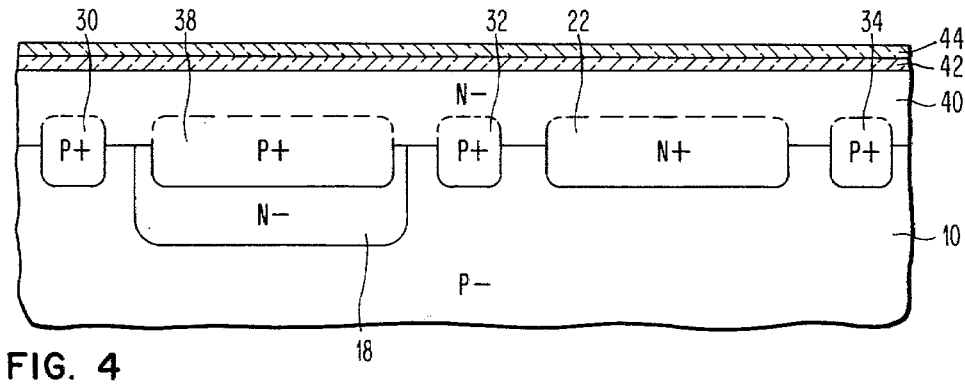
Figure 5:
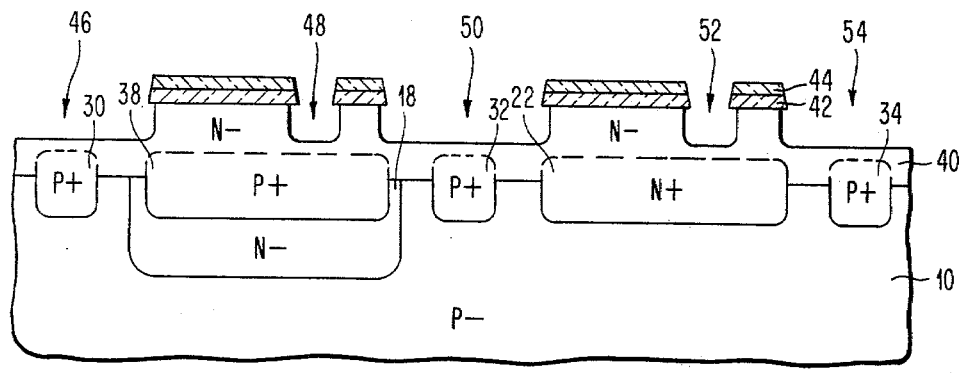

The oxide layer 12 and the oxides covering the diffusion windows are then removed and an N-type epitaxial layer 40 of FIG. 4 is formed on substrate 10 at 1100° C. to form an epitaxial layer having a thickness of 2 microns and a resistivity of 0.3–0.5 ohm/cm². During formation of the expitaxial layer 40 the N+ subcollector region 22, the P+ subcollector region 38 and the P+ isolation stop regions 30, 32 and 34 outdiffuse into the epitaxial layer 40. Because of the relative similarity in concentration between the barrier region 18 and the epitaxial layer 40 there is little if any out-diffusion from barrier region 18 into epitaxial layer 40.

Epitaxial layer 40 is then covered with an oxide layer 42 having a thickness of about 1500 Å and a silicon nitride layer 44 having a thickness of about 1000 Å. Diffusion windows 46, 48, 50, 52 and 54 are then opened through the nitride layer 44 and the oxide layer 42 to form the recessed oxide isolation (ROI) regions 56, 58, 60, 62 and 64 shown in FIG. 6. The silicon is etched to a depth of about 3900 Å for providing the recessed oxide isolation. During oxidation to provide the recessed oxide isolation regions, the silicon oxidizes and grows to fill the areas which have been etched away. Oxidation takes place in an oxygen atmosphere at a temperature of 1000° C. for about 300 minutes to provide a total oxide depth of about 10.5 Å.

Figure 6:
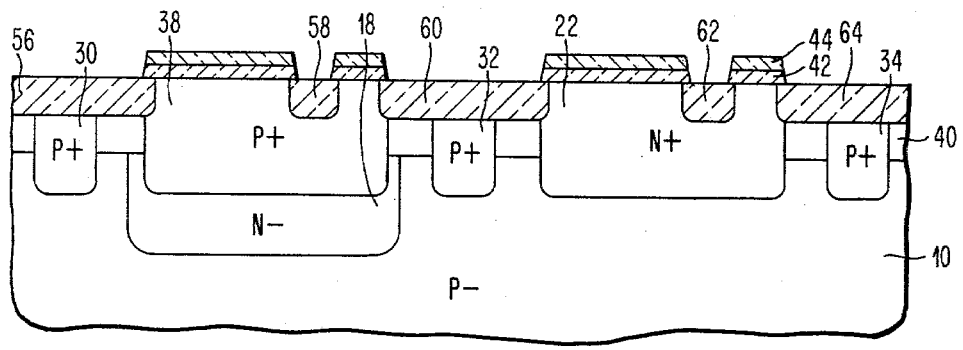
Figure 7:
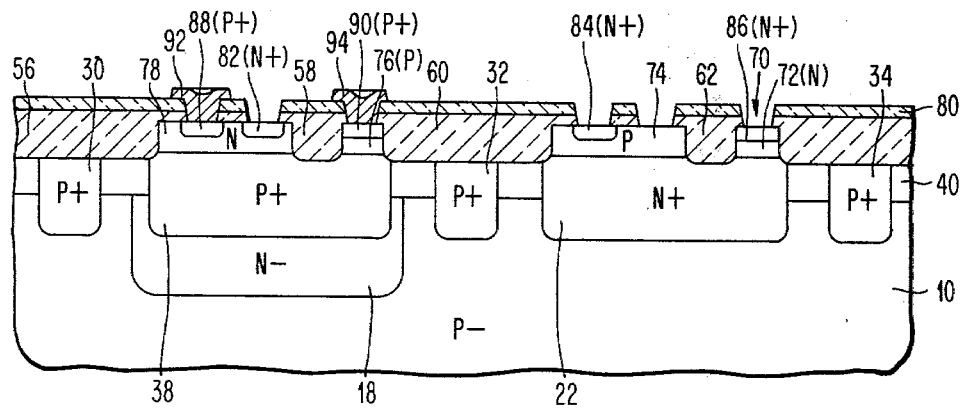

The collector reach through, collector contact, base contact and emitter region for the NPN and PNP transistors are then formed in accordance with the following steps to provide the structure shown in FIG. 7. The silicon nitride layer 44 shown in FIG. 6 is first removed. A diffusion window 70 is opened in the oxide layer to form the collector reach through region 72 for the NPN transistor. The N+ doping for the collector reach through 72 can be affected by capsule diffusion or ion implant. The surface of the silicon is reoxidized to close window 70 and a diffusion window extending across the region 74 is opened for forming the P-type base for the NPN transistor. At the same time, a diffusion window is opened for forming the PNP reach through region 76. The base region 74 and the reach through region 76 are formed simultaneously by either diffusion or ion implant of boron. Ion implant is affected at a power level of about 150 keV at a dosage level of about $5 \times 10^{13}$ ions/cm$^2$. When ion implant is used for forming any doped region, it is effected through an oxide screen which is about 300 Å thick.

The surface of the silicon is then reoxidized to close the windows opened during formation of the base region 74 and the collector reach through region 76. A diffusion window is then masked for forming the base region 78 for the PNP transistor. The base region 78 is formed by ion implant of phosphorus at a power level of 70-100 keV and a dosage of about $2 \times 10^{14}$ ions/cm$^2$.

A silicon nitride layer 80 having a thickness of about 1000 Å is then deposited over the surface of the transistor structure. Windows are then opened for forming the base contact of the PNP transistor 82, the emitter region of the NPN transistor 84 and the collector contact of the NPN transistor 86. The base contact 82, the NPN emitter 84 and the collector contact 86 are then formed either by diffusion or ion implant or arsenic. Ion implant preferably takes place at a power level of about 50 keV and a dosage level of about $1 \times 10^{16}$ ions/cm$^2$.

Windows are then opened for forming the emitter region 88 and the collector contact 90 for the PNP transistor. In a method described more fully hereinbelow, the P-type emitter for the PNP transistor is formed prior to a last drive-in treatment by forming a polycrystalline silicon layer on the exposed surface of the base region. The polycrystalline silicon surface is doped by ion implant with a P-type dopant and thereafter the transistor structure is subjected to conditions whereby the doping ions contained in the polycrystalline layer are driven into the epitaxial layer to form the emitter without effecting dislocations in the silicon lattice of the epitaxial layer.

While not required for effective operation of the complementary transistor device of the present invention, it is convenient to form the collector contact 90 by permitting the polysilicon layer to be formed in place over the collector contact region 90 and doping the polysilicon layer during the formation of the emitter region 88. The drive-in of the doping ions to form the emitter also serves to drive-in the doping ions to form the collector contact 90. The polysilicon 92 remaining over the emitter can be left in place without hindrance to the transistor structure. The polysilicon 94 over the collector contact can also be left in place and metallization can be directly applied to the polysilicon 92 and the polysilicon 94.

DESCRIPTION OF THE PREFERRED EMBODIMENT OF THE PNP EMITTER

Figure 10:
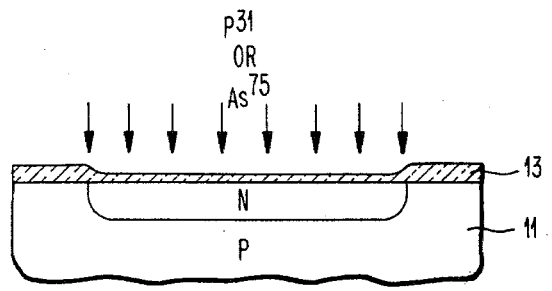
FIGS. 10 to 13 are simplified cross-sectional views, not to scale, showing various steps employed in producing a PNP vertical transistor according to one embodiment of the invention.
Figure 11:
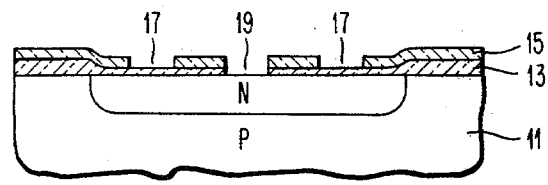
Figure 12:
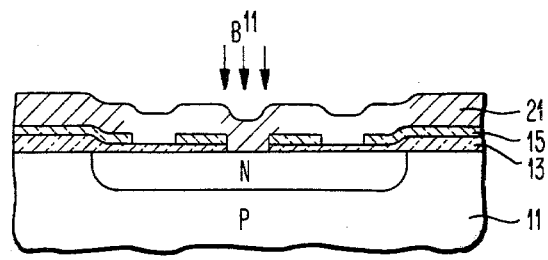

FIGS. 10 to 13, inclusive, illustrate one example of the steps employed in producing a P-type emitter for the PNP semiconductor device according to the invention. A base region B and a reach-through subcollector contact region (not shown) are formed as previously described in a monocrystalline silicon semiconductor substrate 11, as shown in FIG. 10. The base region B is covered with a silicon dioxide film 13 formed during impurity diffusion.

A silicon nitride film 15 is formed over the silicon dioxide film 11. Base contact windows 17 and emitter window 19 are formed through the silicon nitride layer 15 by usual photoetching techniques. The emitter window 19 is opened through the silicon dioxide layer 13 by etching the silicon dioxide film 13 with an etchant for silicon dioxide (for example, hydrochloric acid by the wash-out method) of by reactive ion etching techniques.

Figure 13:
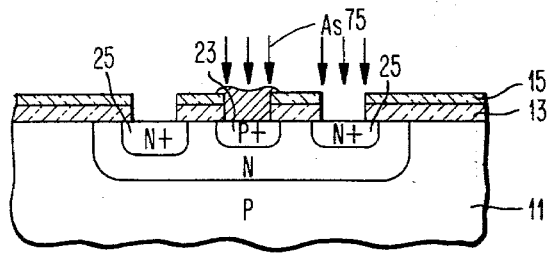

Thereafter, a polycrystalline silicon layer 21 is grown over the entire surface of the substrate assembly. The polycrystalline silicon layer 21 is bombarded by ion implantation under specific conditions to be described more fully hereinbelow with a P-type doping ion. The P-type doping ion is preferably boron. The polycrystalline silicon layer is then etched in the pattern of an emitter electrode as shown in FIG. 13. The substrate assembly is eventually treated by thermal heating or other suitable annealing methods, such as laser treatment, under particular conditions to diffuse the boron from the polycrystalline layer into the base region B to provide a P+ emitter region 23.

Next the area of the silicon dioxide film 13 exposed through the window 17 is removed by the hydrochloric acid wash-out method or by RIE to extend the window 17 down to the surface of the substrate 11. Base contact regions 25 are then formed by ion implantation of an N-type dopant, such as $AS^{75}$ or $P^{31}$. The structure is subsequently metallized in accordance with known practice. Since the doped polysilicon is sufficiently conducting to provide a good ohmic contact with the emitter region 23, the polysilicon remaining above the emitter region 23 can be left as shown in FIG. 13, or can be removed by suitable photoetching technique.

The doping profile of the PNP transistor provided by the above described method is set forth in FIG. 8, which also shows the doping profile of the barrier region 18, previously described. As shown, the emitter region is very shallow and extends only to about 2000

Å. The concentration gradient of the emitter region is extremely steep indicating a very acceptable profile. The beta (current gain) values for PNP transistor devices of the invention are very high compared to known PNP devices. Beta values of greater than 200 have been obtained compared to a beta of less than 10 for conventional PNP devices. The cut off frequency ($f_T$) is also high, i.e., 3.6 GHz, compared to 500 MHz for conventional PNP devices.

The vertical, bipolar PNP transistor structure of the invention can be characterized as having an emitter region with a concentration ($C_0$) of P-type doping ions of at least $1 \times 10^{19}$ ions/cm$^3$ extending to a depth of at least 2000 Å and a $C_0$ of less than about $1 \times 10^{16}$ at a depth of 3500 Å from the surface of the monocrystalline silicon after drive-in. Preferably the emitter region has a $C_0$ of at least $5 \times 10^{19}$ extending to a depth of at least 1500 Å and a $C_0$ of less than about $1 \times 10^{17}$ at a depth of 3000 Å. The concentration characteristics of the P-type emitter of the transistor structure of the invention provide a concentration gradient curve (refer to FIGS. 18, 20 and 22) characterized by high, uniform doping concentration near the surface of the monocrystalline silicon substrate which extends only a shallow distance from the surface and then has a very steep concentration gradient decline. These emitter region characteristics are believed to account for the significant improvement in gain and frequency response attained by the PNP transistor structure of the invention.

Figure 14:
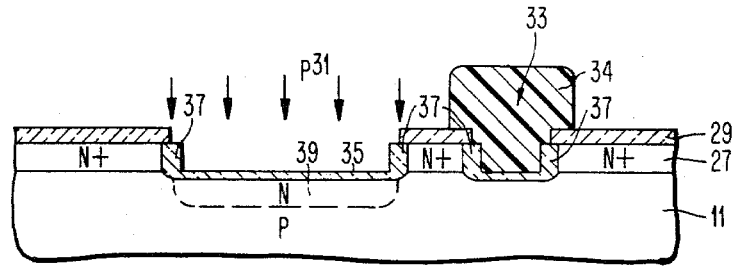
FIGS. 14 to 16 are simplified cross-sectional views, not to scale, showing various steps employed in producing a PNP vertical bipolar transistor according to a second embodiment of the invention wherein a double polysilicon method is used.
Figure 15:
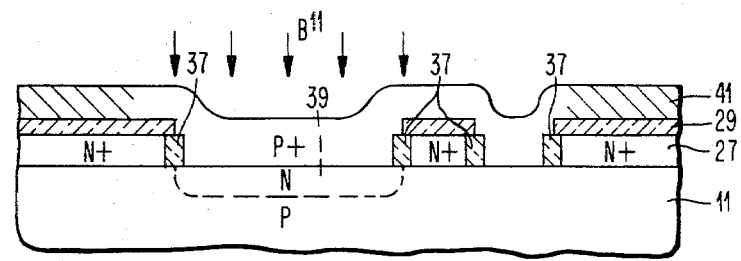
Figure 16:
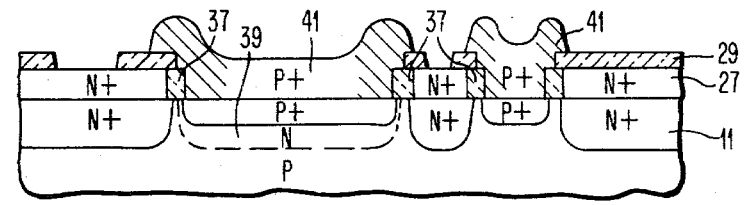

The method of the invention can be used in the preparation of PNP-type transistors by a double polysilicon technique. One such method is illustrated in FIGS. 14 through 16 inclusive. In the illustrated method, a layer of polysilicon 27 is deposited on a monocrystalline silicon substrate 11'. The polysilicon layer 27 is doped with an N-type dopant by ion implantation or other suitable methods. A layer of pyrolytic silicon dioxide 29 is deposited on the polysilicon layer 27. An intrinsic base region 31, which is co-extensive with a subsequent emitter region, is opened in the silicon dioxide layer 29 and the polysilicon layer 27. A collector contact region 33 is opened and coated with photoresist 34 as shown in FIG. 14.

Subsequent to opening the collector contact region 33 and the intrinsic base region 31 the structure is submitted to a re-oxidation step to provide the silicon dioxide layer 35. Since N-doped polysilicon oxidizes at a rate of about 4 times faster than the low-doped monocrystalline silicon, the oxide 37 formed on the sidewall of the polysilicon provides a barrier for the subsequently formed emitter-base junction. This permits the emitter-base junction to be terminated under thermal silicon dioxide. An intrinsic base region 39 is then formed by ion implantation of a suitable N-type dopant such as $P^{31}$ or $AS^{75}$.

A second layer of polysilicon 41 is then deposited over the structure as shown in FIG. 15. The second layer of polysilicon is implanted with $B^{11}$. Thereafter, the subsequent processing is identical to the single polysilicon emitter PNP transistor device previously described in respect to FIGS. 10 through 14. The subsequent processing steps are illustrated in FIGS. 15 and 16.

The provision of a P-doped emitter region in accordance with the present invention is related to the thickness of the polysilicon layer, the ion dosage, the energy used to implant the ion dosage, and the total time-temperature conditions which the transistor structure is submitted to after the ion implantation step. Very generally, it has been discovered that if ion implantation of boron, or other P-type dopant, in the polysilicon layer takes place under conditions whereby the concentration of ions at the interface between the polysilicon layer and the monocrystalline silicon layer is less than the concentration peak of a critical dosage of P-type doping ion the damage incurred during the ion implantation step is insufficient to cause disruption of the monocrystalline silicon layer. Moreover, if the dosage level requirements of the present invention are observed, the drive-in during an annealing step is such as to create a very shallow and highly concentrated emitter region with an extremely steep concentration gradient which is highly suitable for providing the emitter region of a PNP transistor device.

It should be understood that the dosage used in the ion implantation of the P-type dopant in accordance with the invention is in excess of the critical dosage which has been heretofore known to cause irreparable dislocation damage in the implantation of P-type dopants. That is, while the total dosage level for the P-type dopant is in excess of a heretofore known critical level of dosage for this type dopant, the conditions set forth for the implantation of the P-type dopant are such that damage is avoided and an extremely desirable concentration gradient in a shallow emitter form is attained in the surface of the monocrystalline silicon.

Figure 24:
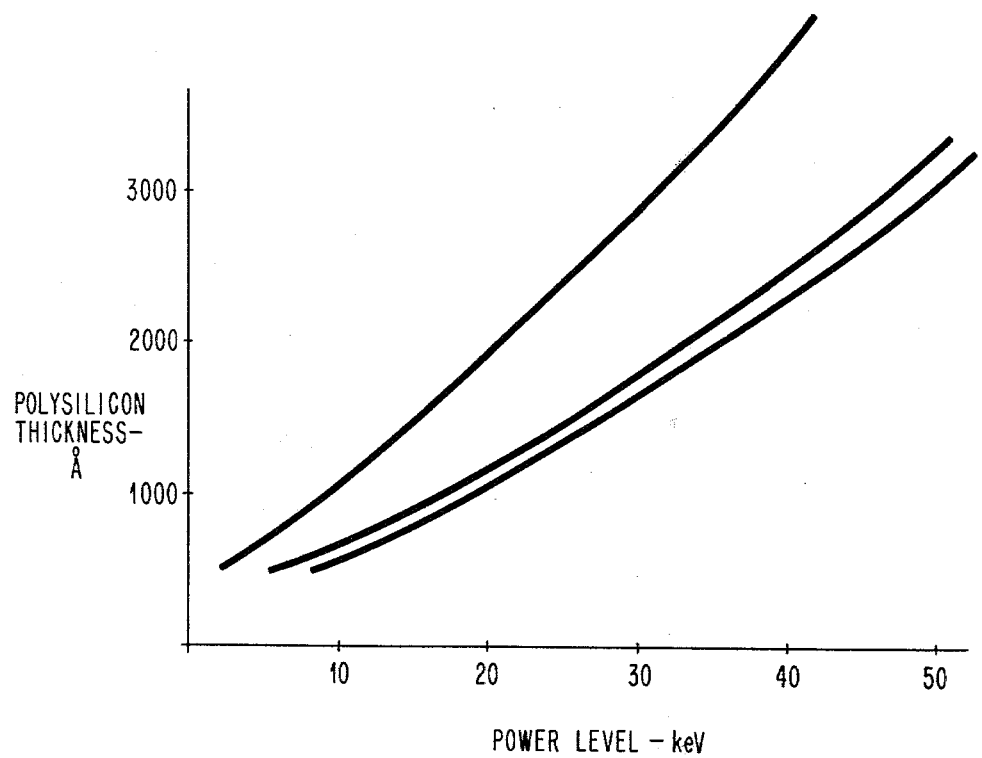
FIG. 24 is a graph showing various operating parameters useful in the practice of the invention.

The critical dosage for P-type dopants in monocrystalline silicon is about $1 \times 10^{15}$ ions/cm$^2$. The dosage level useful in the present invention is in the range of from about $1 \times 10^{16}$ to about $1 \times 10^{17}$ ions/cm$^2$. The power level used to implant the P-type dopant in the polysilicon is dependent upon the thickness of the polysilicon layer. The relationship of power level to polysilicon layer thickness is illustrated by the plot of FIG. 24, where the upper curve indicates minimum power level for a particular polysilicon layer thickness. The intermediate curve indicates optimum power level and the lower curve indicates maximum power level.

After implantation of the P-type dopant in the polysilicon layer, the P-type dopant is driven into the monocrystalline layer by an annealing step. The preferred method for effecting drive-in of the P-type dopant is by thermal annealing. Thermal heat treatment at a temperature of from about 900° C. to about 1100° C. for a period of from about 90 minutes at the lower temperature of about 2 minutes at the higher temperature has been found to be suitable. For ease of control, the thermal heat treatment is preferably at a temperature of from about 950° C. to 1000° C. for a period of from about 60 minutes at the low temperature to about 45 minutes at the high temperature. Most preferably the heat treatment is at 1000° C. for 30 minutes and other equivalent time-temperature relations. In this connection, it should be understood that the total heat treatment to which the transistor device is subjected after the implantation of the P-type dopant should not exceed the equivalent of the described suitable heat treatment conditions. If other ion implant areas requiring drive-in, such as base contact regions, are established in the transistor device, the drive-in should be effected before or concurrently with the emitter region drive-in.

Examples

Figure 17:
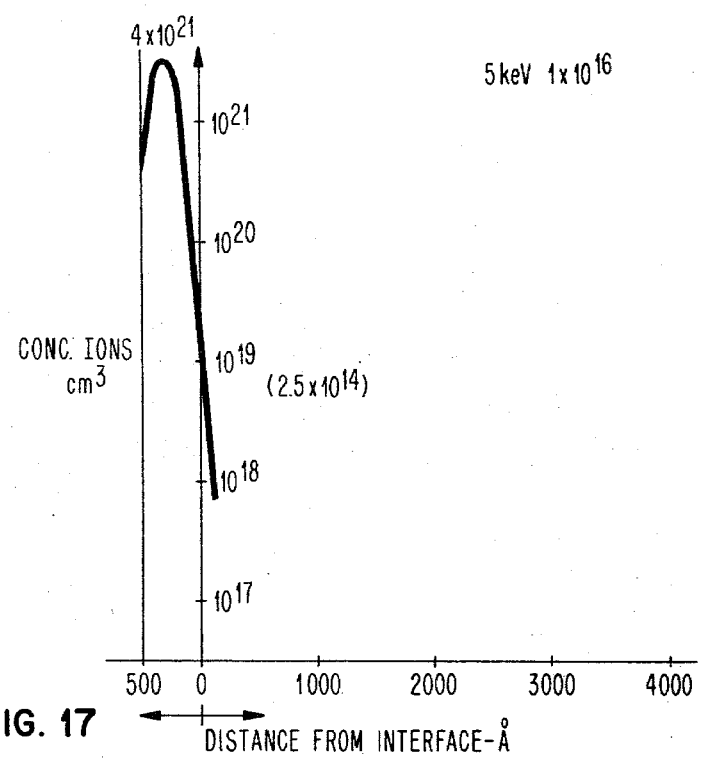
FIGS. 17 through 22 are graphs showing the relationship of various operating parameters of the invention.
Figure 18:
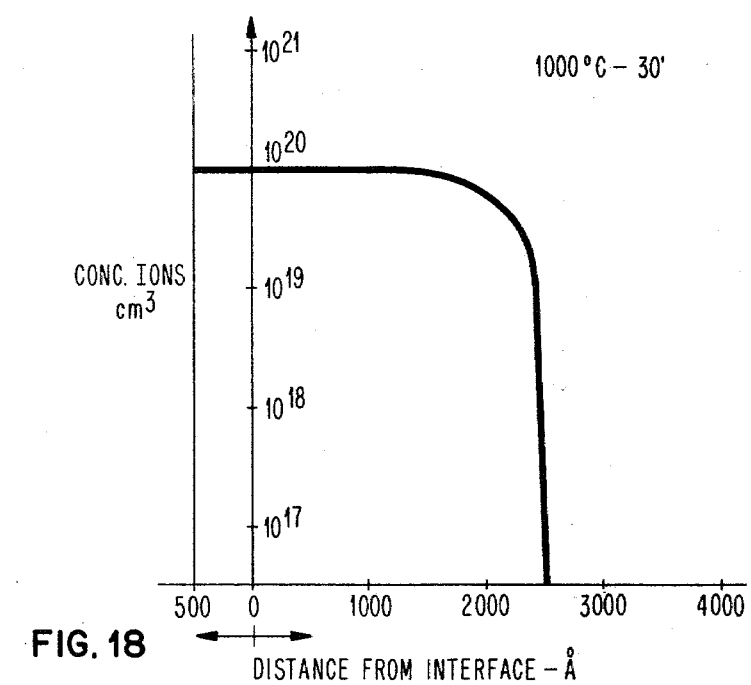

Various operating features of the invention are illustrated in FIGS. 17–22 for various thicknesses of polysilicon layers. As shown in FIG. 17, a polysilicon layer is deposited having a thickness of 500 Å. The polysilicon layer is implanted with boron ions at a dosage of $1\times10^{16}$ ions/cm². The energy used for the implantation is 5 keV. Under these conditions the distribution of the ions in the polysilicon layer after implantation is shown in FIG. 17. After the implantation step, the boron is driven into the monocrystalline silicon layer to provide an emitter region by annealing the transistor structure for a total period of 30 minutes at a temperature of 1000° C. The resulting distribution profile for the emitter region is shown in FIG. 18. From FIG. 18 it is seen that the concentration is uniform at about $10^{20}$ ions/cm² for a depth of about 2000 Å.

Referring to FIG. 17, it can be seen that the concentration of ions at the interface of the polysilicon layer and the monocrystalline layer is about $10^{19}$. The dosage required to provide a Gaussian distribution having a peak of about $10^{19}$ ions/cm³ is about $2.5\times10^{14}$ ions/cm² at an energy level of about 5 keV. This is well below the critical dosage of $1\times10^{15}$ ions/cm². Accordingly, the conditions used for ion implantation to produce the structure illustrated in FIG. 17 meet a basic requirement of the present invention that the concentration of the ions at the interface should be less than would be produced by a critical dosage whose distribution peak occurs at the interface.

Figure 19:
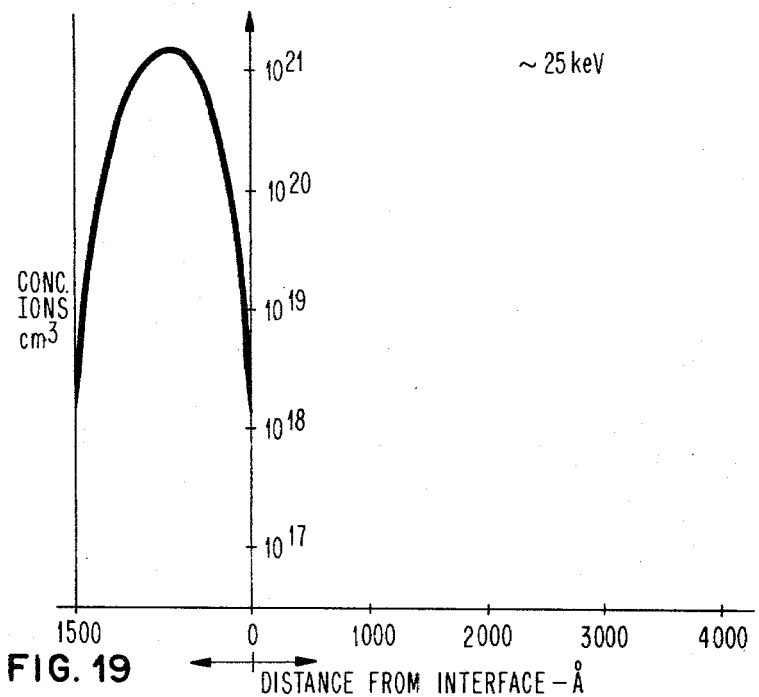
Figure 20:
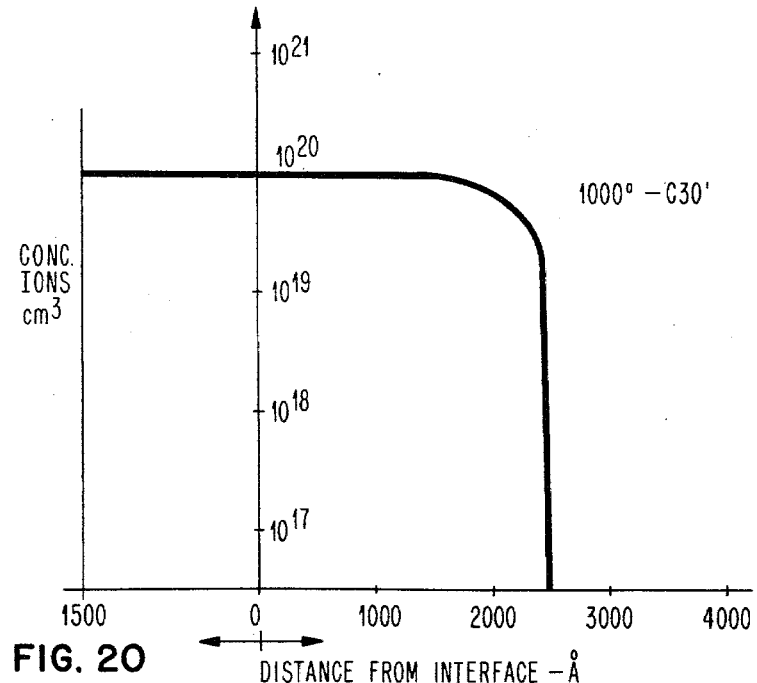

FIGS. 19 and 20 illustrate the distribution after ion implantation and after annealing for a polysilicon layer thickness of 1500 Å. The ion implantation is at a power level of 25 keV and a dosage of $10^{16}$ ions/cm². The annealing step is performed at a temperature of 1000° C. for 30 minutes.

Figure 21:
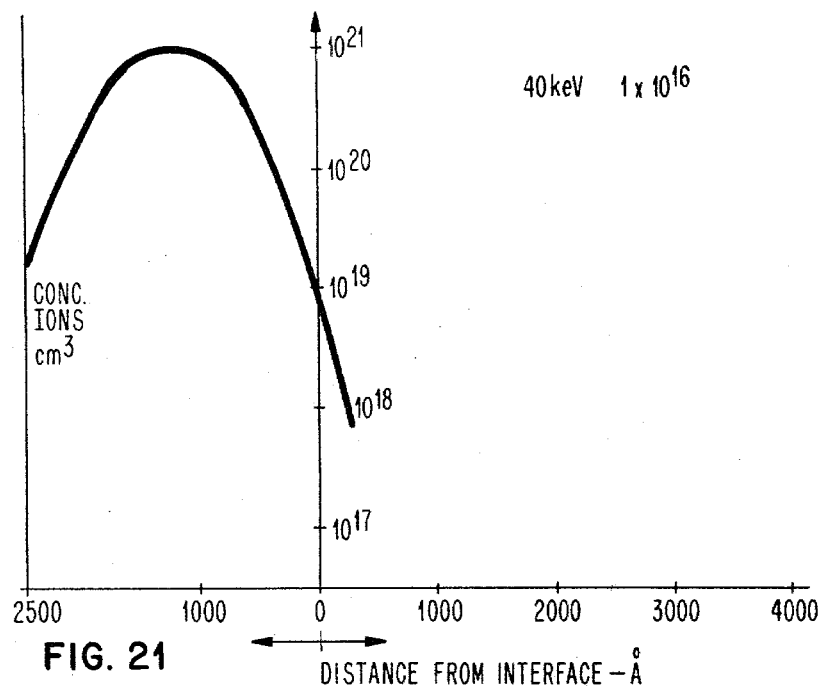
Figure 22:
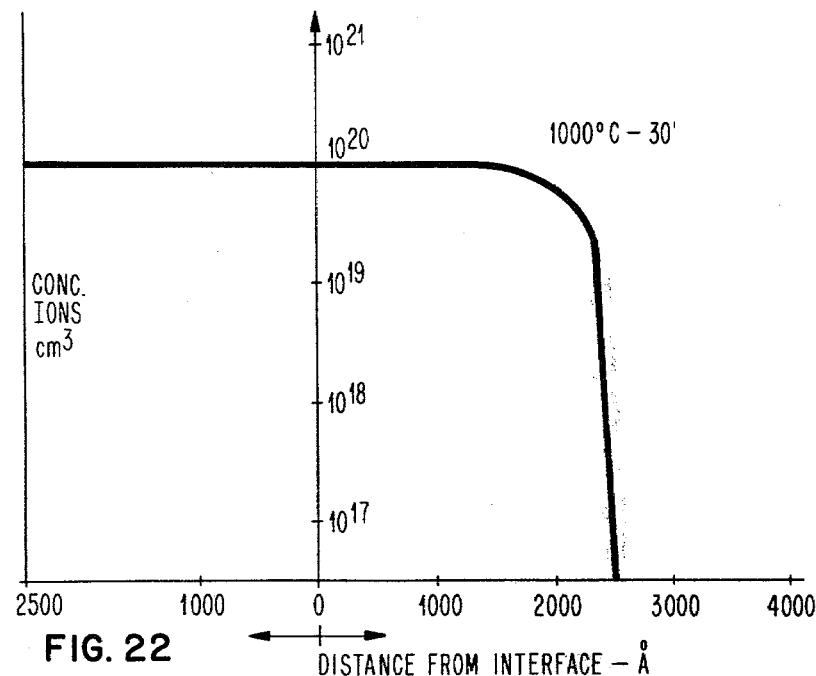

FIGS. 21 and 22 illustrate the concentration profile after ion implantation and the annealing step for a polysilicon layer thickness of 2500 Å. The ion implantation is performed at a power level of 40 keV and a dosage of $10^{16}$ ions/cm². The annealing step is performed at a temperature of 1000° C. for 30 minutes.

In each case illustrated in FIGS. 17–22, despite the varying thickness of the polysilicon layer, it is seen that the emitter region has approximately the same maximum concentration of ions and approximately the same depth. It follows that the total loading of the polysilicon layer is approximately equivalent despite the thickness of the layer. The total loading of the implanted boron ions is compressed and the peak of the distribution is greater as the polysilicon layer is reduced in thickness.

Figure 23:
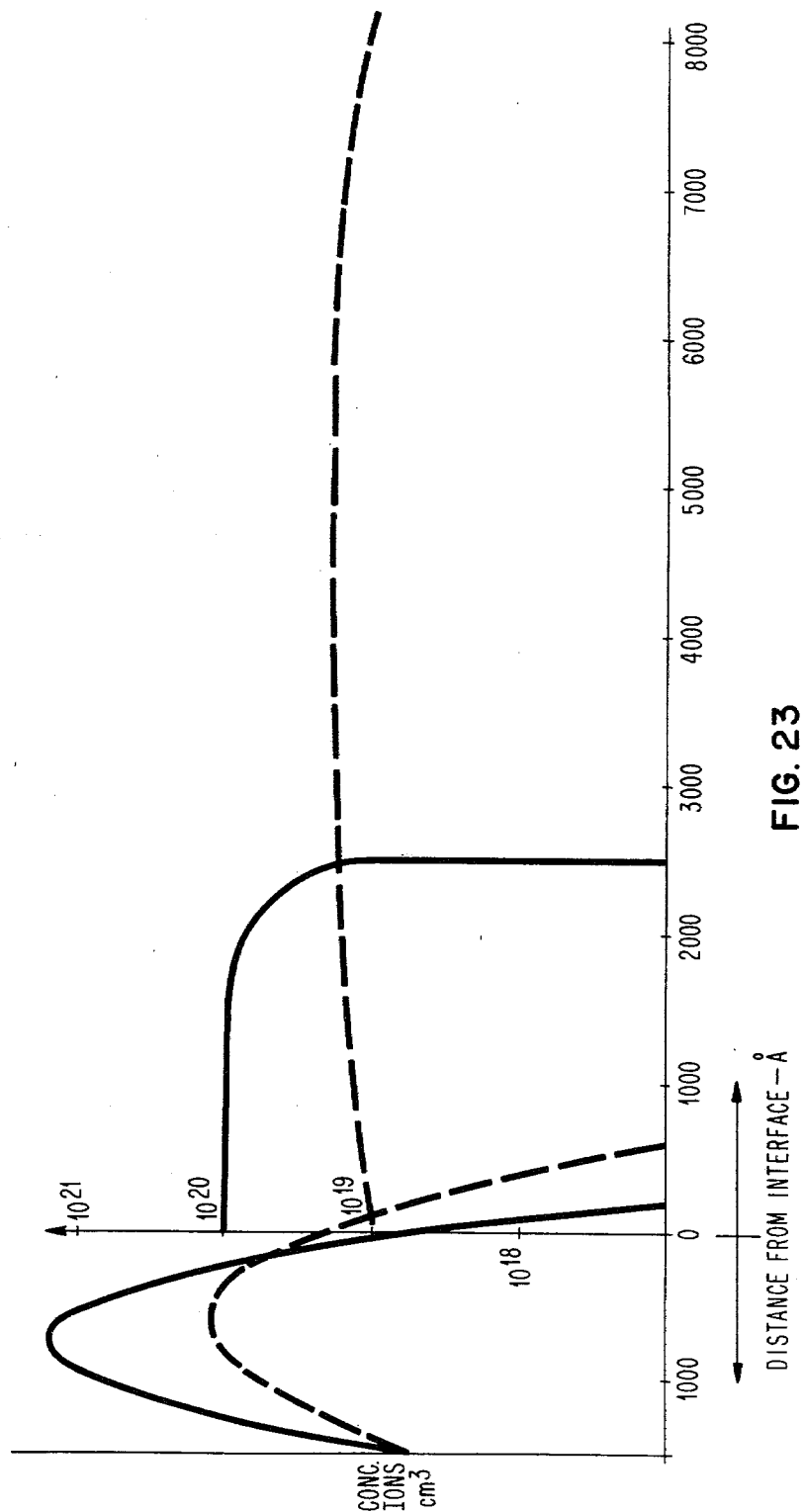
FIG. 23 is a graph showing the comparison of the emitter structure for the PNP transistor produced in accordance with the present invention to the prior art.

FIG. 23 illustrates differences in the operating conditions of the present invention as compared to the prior art. As shown in FIG. 23, the dashed line represents the ion implantation of boron in a polysilicon layer as described in an article of Akasaka et al., "Application of Diffusion from Implanted Polycrystalline Silicon to Bipolar Transistors", Japanese Journal of Applied Physics, Vol. 15 (1976), Supplement 15-1, pp. 49–54. In the Akasaka article, boron is implanted in a polysilicon layer using a dosage of about that of the critical dosage. The dosage of the boron for a polysilicon thickness of 1500 Å was $1\times10^{15}$ ions/cm². The distribution in the polysilicon layer is as shown by the dashed line to the left of the vertical interface line in FIG. 23. After annealing to drive in the boron to produce a base region, the distribution in the monocrystalline silicon layer is as shown in the dashed line to the right of the interface of FIG. 23. In accordance with the present invention using a dosage in excess of the critical dosage of $1\times10^{16}$ ions/cm² at a power level of 25 keV, the distribution shown by the solid line to the left of the interface in FIG. 23 is attained. After an annealing cycle, an emitter region having the distribution shown by the solid line to the right of the interface of FIG. 23 is attained.

In general, a dosage of from about $1\times10^{16}$ to about $1\times10^{17}$ ions/cm² is used to attain the desired loading of the polysilicon layer in accordance with the invention. The power level required to implant the dosage and attain the desired distribution within the polysilicon layer is related to the thickness of the polysilicon layer. In general, the optimum power level is that shown by the middle line in FIG. 24. Other power levels can be used and the minimum and maximum power level that can be used is represented by the lower and upper lines of the graph of FIG. 24. As an example, for a polysilicon layer thickness of 500 Å, a power level in the range of from about 2 to about 8 keV can be used. For a polysilicon layer thickness of 1500 Å, a power level in the range of from about 15 to about 27 keV can be used. For a polysilicon layer thickness of 2500 Å a power level in the range of from about 25 to about 43 keV can be used.

The present invention is not limited specifically to the foregoing examples and many modifications and variations may be affected without departing from the scope of the invention which is set forth in the appended claims.

We claim:

1. A transistor structure including at least one vertical bipolar PNP transistor comprising:
   a substrate of P-type monocrystalline semiconductor material;
   a N-type barrier region formed in the surface of said substrate;
   a P-type collector region for said transistor formed within said barrier region, wherein the impurity concentration of said barrier region at the junction of said barrier region and said collector region is in the range from about $1\times10^{16}$ to about $5\times10^{17}$ atoms/cc and the peak impurity concentration of said collector is in the range from about $1\times10^{18}$ to about $1\times10^{20}$ atoms/cc;
   an N-type epitaxial layer formed on the surface of said substrate over said collector and said barrier region;
   a N-type base region for said transistor formed in the surface of said epitaxial layer;
   an emitter region provided in said base region and doped with a P-type impurity from a polycrystalline source layer containing P-type dopants, the emitter region having a surface concentration of P-type doping ions of at least about $1\times10^{19}$ atoms/cc extending to a depth of at least about 2000 Å from the surface and a concentration of less than about $1\times10^{16}$ atoms/cc at a depth of 3500 Å;
   a base contact region formed within said base region; and
   a collector contact region formed in the surface of said epitaxial layer which extends into contact with said collector region.

2. A transistor structure including at least one vertical bipolar PNP transistor comprising:
   a substrate of P-type monocrystalline semiconductor material;
   a N-type barrier region formed in the surface of said substrate;
   a P-type collector region for said transistor formed within said barrier region, wherein the impurity concentration of said barrier region at the junction of said barrier region and said collector region is in the range from about $1 \times 10^{16}$ to about $5 \times 10^{17}$ atoms/cc and the peak impurity concentration of said collector is in the range from about $1 \times 10^{18}$ to about $1 \times 10^{20}$ atoms/cc;

an N-type epitaxial layer formed on the surface of said substrate over said collector and said barrier region;

a N-type base region for said transistor formed in the surface of said epitaxial layer;

an emitter region provided in said base region and doped with a P-type impurity from a polycrystalline source layer containing P-type dopants, the emitter region having a surface concentration of P-type doping ions of at least about $5 \times 10^{19}$ atoms/cc extending to a depth of at least about 1500 Å from the surface and a concentration of less than about $1 \times 10^{17}$ atoms/cc at a depth of 3000 Å;

a base contact region formed within said base region; and a collector contact region formed in the surface of said epitaxial layer which extends into contact with said collector region.

3. A transistor structure including a complementary air of vertical bipolar transistors comprising:

a barrier region of a first conductivity type formed in the surface of a monocrystalline semiconductor substrate doped with a second conductivity type;

a collector region for one of said transistors of said second conductivity type formed within said barrier region, wherein the impurity concentration of said barrier region at the junction of said barrier region and said collector region formed within said barrier region is in the range from about $1 \times 10^{16}$ to about $5 \times 10^{17}$ atoms/cc and the peak impurity concentration of said collector is in the range from about $1 \times 10^{18}$ to about $1 \times 10^{20}$ atoms/cc;

a collector region of a first conductivity type for the other of said complementary transistors formed in the surface of said substrate;

an epitaxial layer of semiconductor material doped with said first conductivity type formed on the surface of said substrate over said collectors and said barrier region;

a base region for said transistors of said first conductivity type formed in the surface of said epitaxial layer;

a base region for the other of said complementary transistors of said second conductivity type formed on said collector region of the first conductivity type;

emitter and base contact regions for said transistors formed within said base regions wherein the emitter region of said one of said complementary transistors is doped with an impurity of said second conductivity type from a polycrystalline source layer and wherein said emitter region has an impurity concentration of at least $1 \times 10^{19}$ atoms/cc extending to a depth of at least about 2000 Å from the surface and a concentration of less than about $1 \times 10^{16}$ atoms/cc at a depth of 3500 Å; and a collector contact region for each transistor formed in the surface of said epitaxial layer which extends into contact with said collector region.

4. A transistor structure including a complementary pair of vertical bipolar transistors comprising:

a barrier region of a first conductivity type formed in the surface of a monocrystalline semiconductor substrate doped with a second conductivity type;

a collector region for one of said transistors of said second conductivity type formed within said barrier region;

wherein the impurity concentration of said barrier region at the junction of said barrier region and said collector region formed within said barrier region is in the range from about $1 \times 10^{16}$ to about $5 \times 10^{17}$ atoms/cc and the peak impurity concentration of said collector is in the range from about $1 \times 10^{18}$ to about $1 \times 10^{20}$ atoms/cc;

a collector region of a first conductivity type for the other of said complementary transistors formed in the surface of said substrate;

an epitaxial layer of semiconductor material doped with said first conductivity type formed on the surface of said substrate over said collectors and said barrier region;

a base region for said transistors of said first conductivity type formed in the surface of said epitaxial layer;

a base region for the other of said complementary transistors of said second conductivity type formed on said collector region of the first conductivity type;

emitter and base contact regions for said transistors formed within said base regions wherein the emitter region of said one of said complementary transistors is doped with an impurity of said second conductivity type from a polycrystalline source layer and wherein said emitter region has an impurity concentration of at least $5 \times 10^{19}$ atoms/cc extending to a depth of at least about 1500 Å from the surface and a concentration of less than about $1 \times 10^{17}$ atoms/cc at a depth of 3000 Å; and a collector contact region for each transistor formed in the surface of said epitaxial layer which extends into contact with said collector region.

5. A transistor structure in accordance with claims 3 or 4 wherein said one transistor and said other transistor are PNP and NPN transistors, respectively, and wherein said first and said second conductivity type are N-type and P-type conductivity, respectively.

* * * * *